(12) United States Patent
Johnson, Jr. et al.

(10) Patent No.: US 7,760,516 B2
(45) Date of Patent: Jul. 20, 2010

(54) MODULAR UPS SYSTEMS AND METHODS USING MODULAR INTERCONNECT ASSEMBLIES

(75) Inventors: Robert W. Johnson, Jr., Raleigh, NC (US); Lennart Rune Jonsson, Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 1160 days.

(21) Appl. No.: 11/378,140

(22) Filed: Mar. 17, 2006

(65) Prior Publication Data

US 2007/0217178 A1 Sep. 20, 2007

(51) Int. Cl.
*H02B 1/20* (2006.01)
(52) U.S. Cl. ........................... 361/826; 361/600
(58) Field of Classification Search .............. 361/600, 361/826, 724; 439/21, 210
See application file for complete search history.

(56) References Cited

U.S. PATENT DOCUMENTS

| | | | |
|---|---|---|---|
| 6,301,095 B1 * | 10/2001 | Laughlin et al. ............. 361/624 |
| 6,967,283 B2 | 11/2005 | Rasmussen et al. |
| 7,187,265 B1 * | 3/2007 | Senogles et al. ............. 340/3.5 |
| 7,236,896 B2 * | 6/2007 | Farkas et al. ................. 702/60 |
| 2003/0043566 A1 * | 3/2003 | Tsunoda et al. ............. 361/826 |
| 2007/0291430 A1 * | 12/2007 | Spitaels et al. ................ 361/79 |

* cited by examiner

*Primary Examiner*—Michael C Zarroli
(74) *Attorney, Agent, or Firm*—Myers Bigel Sibley & Sajovec, PA

(57) ABSTRACT

A modular uninterruptible power supply (UPS) system includes a plurality of UPS system component modules, each configured to be arranged in at least one equipment rack, each of the UPS system component modules having at least one flexible power cable extending therefrom and having a pluggable first connector at an end thereof. The system also includes a modular power interconnect assembly configured to be attached to at least one equipment rack, the modular power interconnect assembly including a housing, a plurality of bus bars positioned within the housing, and a plurality of second connectors positioned at a face of the housing, electrically connected to the plurality of bus bars and configured to pluggably mate with the first connectors to provide electrical interconnection among the plurality of UPS system component modules.

18 Claims, 14 Drawing Sheets

MODULAR UPS SYSTEMS AND METHODS USING MODULAR INTERCONNECT ASSEMBLIES

BACKGROUND OF THE INVENTION

The present invention relates to power distribution apparatus and methods and, more particularly, to power distribution for modular electronic systems.

Internet server farms and other large-scale data processing installations often include a large number of computers, peripherals and communications devices that host web sites, process transactions, manage financial and personal information, and other data processing and communications tasks. These installations are often constructed in a modular fashion, e.g., an installation may include a battery of standardized equipment racks (e.g., 19-inch racks) in which multiple computers and data communications devices, e.g., routers, hubs and the like, may be housed. Similar modular architectures may be used in telecommunications systems.

Typically, it is desirable for such installations to have high availability and reliability, such that, for example, data integrity and/or access is preserved even during disruptive events, such as power failures arising from storms, system overloads or other disturbances. Accordingly, such installations typically are powered by uninterruptible power supplies (UPSs), which can improve power quality and/or provide back up power to computing and communications equipment from an alternative source, such as a battery, generator or fuel cell, when utility power fails or is degraded.

Modular UPS systems have been proposed for such installations. For example, some manufacturers offer rackmount UPSs that are configured to be mounted in a standard (e.g., 19-inch) equipment rack, and that are hardwired (e.g., using lugs or screw terminals) to provide power interconnections. Some modular designs may include a chassis having a subrack or similar structure configured with a backplane or connector field that mates with power modules that slide into the subrack.

U.S. Pat. No. 6,967,283 to Rasmussen et al. describes systems and methods for installing computer equipment and power distribution equipment in facilities. Each of a plurality of equipment racks has a power input to receive power for equipment contained therein. A power distribution rack provides power to the equipment racks and includes a power distribution panel and a plurality of output power cables. A first end of an output cable is coupled to the power distribution panel and a second end of the output cable has a mating connector that pluggably mates with the power input of an equipment rack. The power cables are run from the power distribution rack to the equipment racks using power cable tracks that are located on roofs of the equipment racks.

While such an arrangement may have benefits, there is an ongoing need for improved power distribution techniques for such applications.

SUMMARY OF THE INVENTION

In some embodiments of the present invention, a modular uninterruptible power supply (UPS) system includes a plurality of UPS system component modules, each configured to be arranged in at least one equipment rack, each of the UPS system component modules having at least one flexible power cable extending therefrom and having a pluggable first connector at an end thereof. The system also includes a modular power interconnect assembly configured to be attached to at least one equipment rack, the modular power interconnect assembly including a housing, a plurality of bus bars positioned within the housing, and a plurality of second connectors positioned at a face of the housing, electrically connected to the plurality of bus bars and configured to pluggably mate with the first connectors to provide electrical interconnection among the plurality of UPS system component modules. The plurality of UPS system component modules may include, for example, a UPS module, a battery module, a transformer module, a switch module, and/or a power distribution unit (PDU) module.

The system may further include at least one equipment rack. The plurality of UPS system component modules may be arranged in the at least one equipment rack, and the modular power interconnect assembly is attached to the at least one equipment rack. Respective ones of the first connectors may be pluggably mated with respective ones of the second connectors such that the power interconnect assembly provides electrical interconnection among the plurality of UPS system component modules.

In some embodiments, the UPS system component modules are arranged in a row or column. The power interconnect assembly housing includes an elongate housing, the plurality of bus bars includes elongate bus bars arranged substantially in parallel and extending along a length of the elongate housing, and the plurality of second connectors are spaced along the length of the housing. The power interconnect assembly extends along the row or column of UPS system component modules.

For example, in some embodiments of the present invention, the UPS system component modules are positioned in a vertical column in a single equipment rack, and the power interconnect assembly is mounted vertically in and/or on the single equipment rack. In other embodiments, the UPS system component modules are positioned in a horizontal row of equipment racks and the power interconnect assembly is mounted horizontally in and/or on the row of equipment racks.

In additional embodiments of the present invention, the plurality of UPS system component modules includes a plurality of UPS modules, and the power interconnect assembly provides input and/or output paralleling of the UPS modules. In some embodiments, the plurality of UPS system component modules includes a plurality of UPS modules, the power cables include power output cables coupled to power outputs of the UPS modules and the power interconnect assembly provides output paralleling of the UPS modules. The UPS modules may further include power outlets electrically coupled to the power outputs and configured to be electrically coupled to external loads.

Further embodiments of the present invention provide an electronic system including a UPS system as described above in combination with at least one load in at least one equipment rack. The at least one load may be configured to operate redundantly from power supplies at first and second power inputs thereof, and respective power outlets of respective first and second ones of the UPS modules may be electrically coupled to respective ones of the first and second power inputs of the at least one load. The at least one equipment rack may includes a plurality of equipment rack and the at least one load may include a plurality of loads, respective ones of which are positioned in respective ones of the plurality of equipment racks. Respective ones of the plurality of UPS modules may be positioned in respective ones of the plurality of equipment racks, and the power interconnect assembly may be configured to provide output paralleling of the plurality of UPS modules. The outlets of the UPS modules may be electrically coupled to the first power inputs of the loads, and second power inputs of the loads may be electrically coupled to an alternative power source.

In further embodiments of the present invention, the plurality of UPS system component modules includes a power distribution module and a UPS module. The power cables include a first power cable coupled to a power output of the UPS module and a second power cable coupled to a power input of the power distribution module. The power interconnect assembly electrically interconnects the power output of the UPS module and the power input of the power distribution unit. The plurality of UPS system component modules may further include a transformer module, and the power cables may further include a third power cable coupled to the transformer module and a fourth power cable coupled to the UPS module. The power interconnect assembly may electrically interconnect the transformer module and the UPS module.

Additional embodiments provide fabrication methods. A plurality of UPS system component modules is arranged in at least one equipment rack, each of the UPS system component modules having at least one flexible power cable extending therefrom and having a pluggable first connector at an end thereof. A modular power interconnect assembly is mounted in and/or on the at least one equipment rack. The power interconnect assembly including a housing, a plurality of bus bars positioned within the housing, and a plurality of second connectors positioned at a face of the housing, electrically connected to the plurality of bus bars and configured to pluggably mate with the first connectors. Respective ones of the first connectors may be pluggably mated with respective ones of the second connectors such that the power interconnect assembly provides electrical interconnection among the plurality of UPS system component modules.

DETAILED DESCRIPTION

Figure 1A:
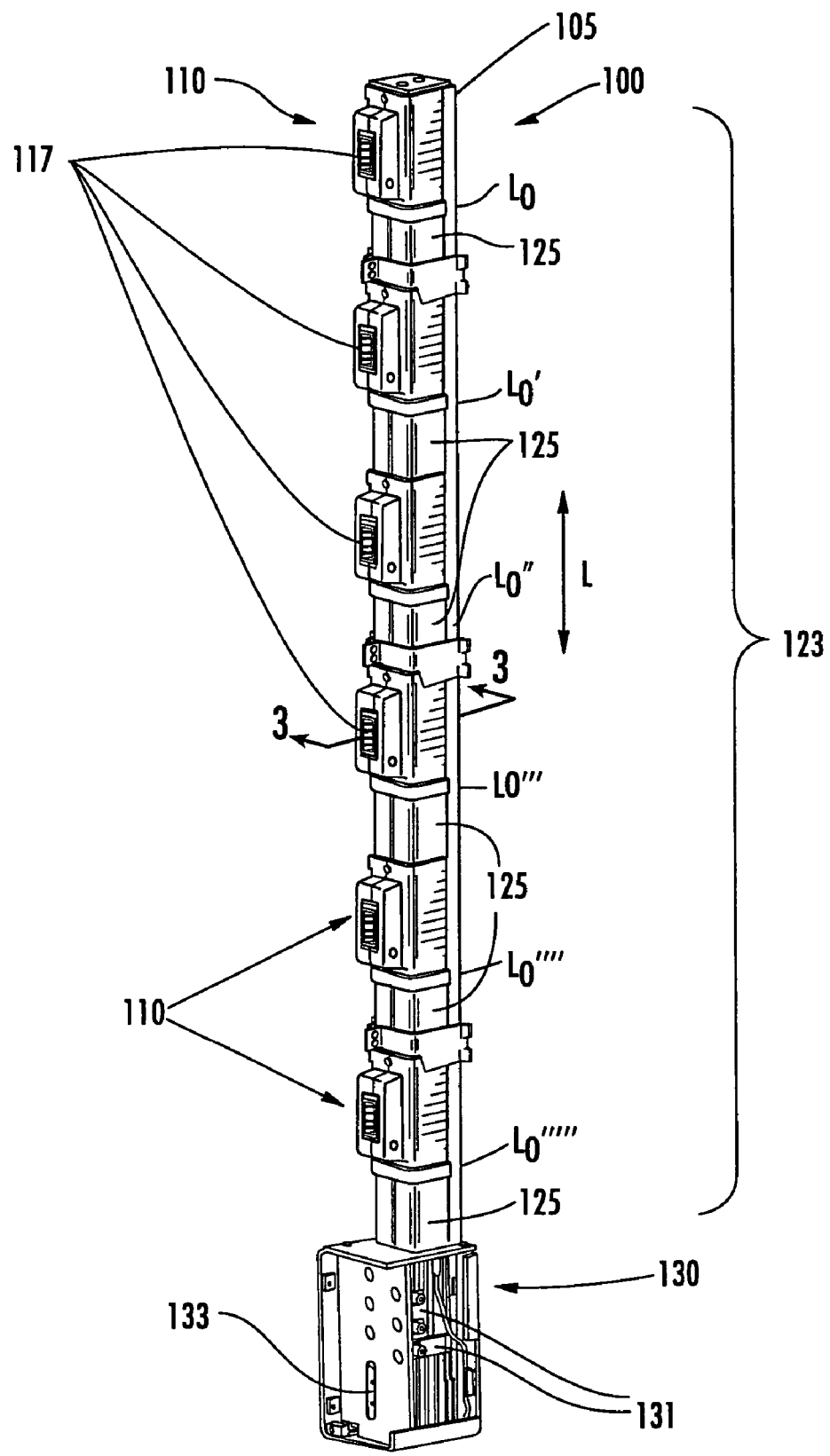
FIG. 1A is a perspective view of a power interconnect assembly according to some embodiments of the present invention.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular exemplary embodiments illustrated in the accompanying drawings is not intended to be limiting of the invention. In the drawings, like numbers refer to like elements.

As used herein, the singular forms "a", "an" and "the" are intended to include the plural forms as well, unless expressly stated otherwise. It will be further understood that the terms "comprises," "includes," "comprising" and/or "including," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
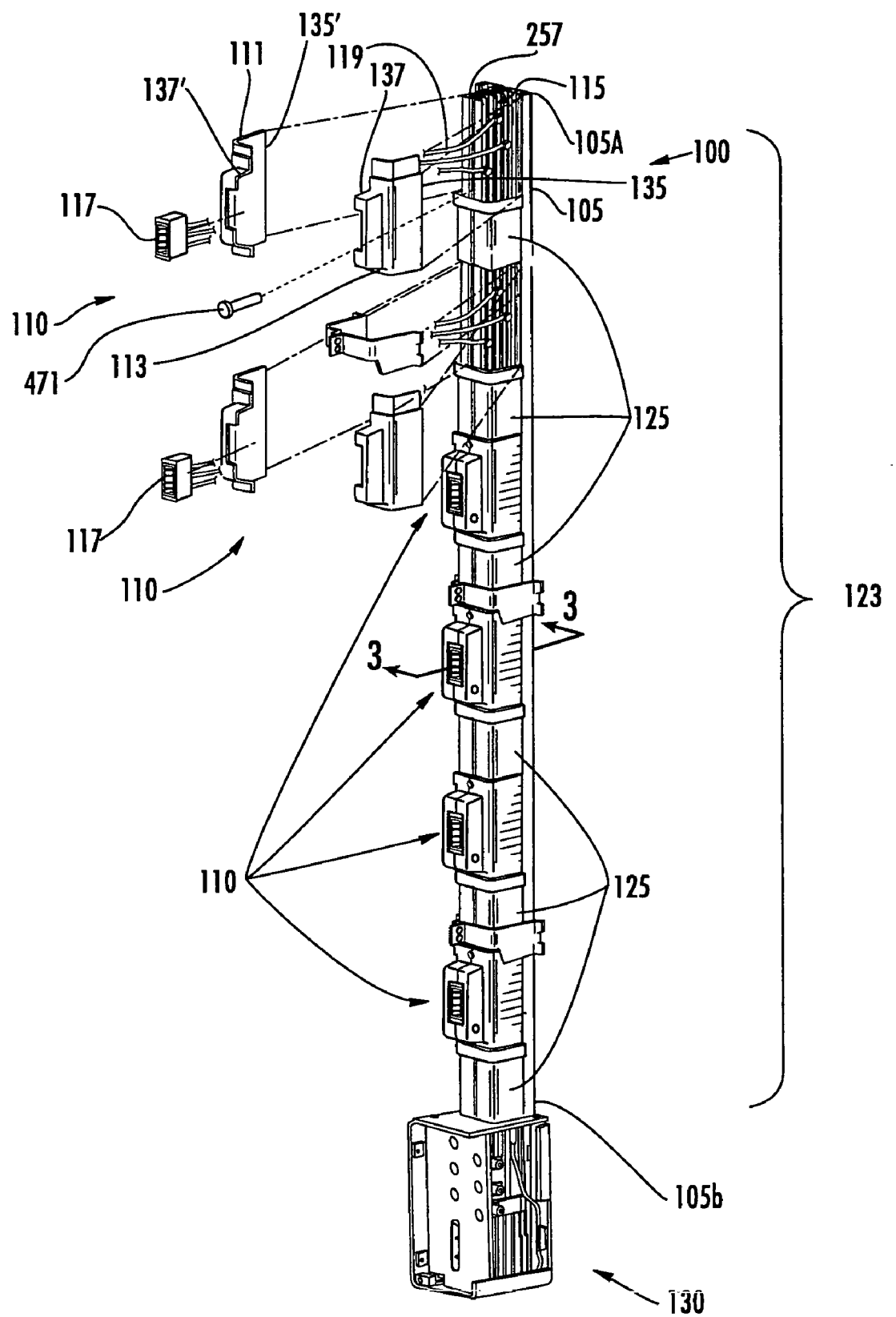
FIG. 1B is an exploded perspective view of the power interconnect assembly of FIG. 1A.
Figure 2:
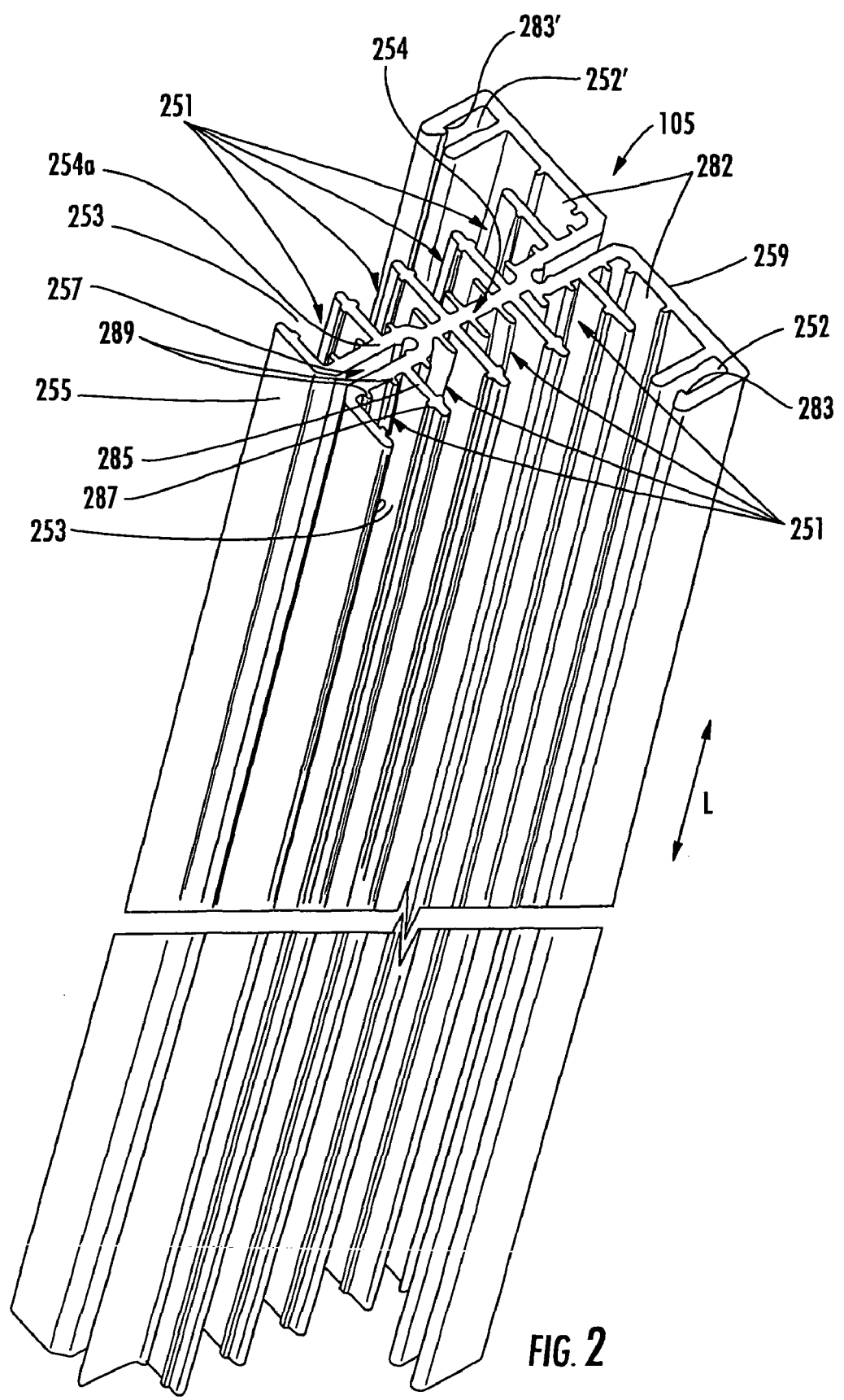
FIG. 2 is a perspective view of a based member for a power interconnect assembly according to some embodiments of the present invention.
Figure 3:
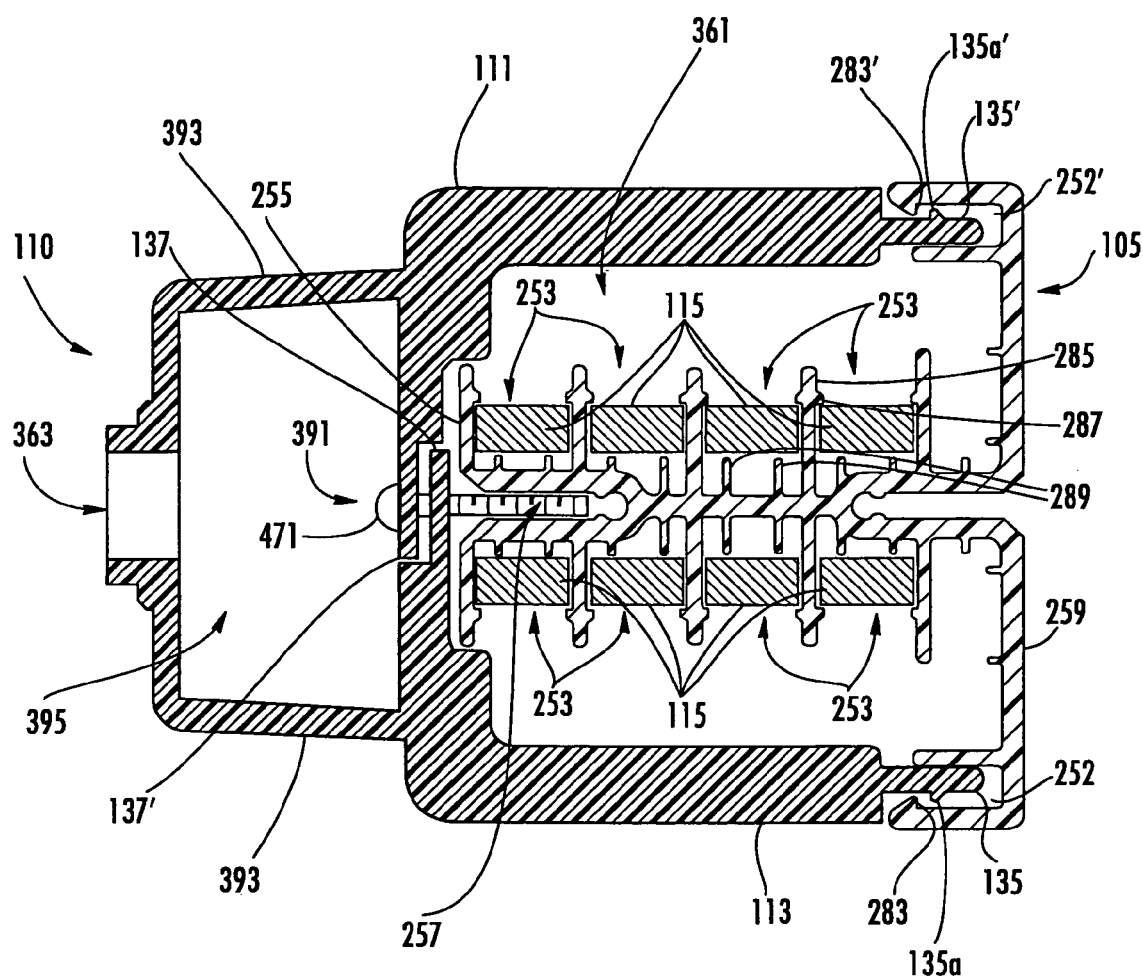
FIG. 3 is a cross-sectional view taken along line 3-3 of FIG. 1.

Power interconnect assemblies 100 according to some embodiments of the present invention will now be described with reference to FIGS. 1A through 7B. FIG. 1A is a perspective view of a power interconnect assembly 100 and FIG. 1B is a partially exploded perspective view of the power interconnect assembly 100 of FIG. 1A. FIG. 3 is a cross-sectional view of the power interconnect assembly 100 of FIG. 1A, taken generally along a line 3-3 as shown in FIG. 1A.

As shown in FIGS. 1A, 1B and 3, a power interconnect assembly 100, according to some embodiments of the present invention, includes a longitudinally extending base member 105 with one or more interconnect modules 110 coupled to the base member 105. The power interconnect assembly 100 includes a longitudinally extending interconnect module receiving portion 123 and a termination section 130 on an end thereof.

The interconnect module receiving portion 123 is configured to receive a plurality of longitudinally spaced interconnect modules 110. Note that, as used herein, the longitudinal direction refers to the direction indicated by the arrow L of FIG. 1A. As further seen in the embodiments of FIGS. 1A and 1B, spacer members 125 coupled to the base member 105 extend longitudinally between and abut ones of the interconnect modules 110. The interconnect modules 110 and spacer members 125 extend from a first end 105a of the base member 105 to a second end 105b of the base member 105 to define a cavity 361 (FIG. 3). As best seen in FIGS. 1B and 3, a plurality of longitudinally extending bus bars 115 of the power interconnect assembly 100 are enclosed by the cavity 361. As the bus bars 115 may be coupled to high voltage and/or current sources, the enclosing cavity 361 may provide for protection from unintended incidental contact with such high voltage and/or current sources.

Embodiments of the base member 105 will now be further described with reference to the perspective view illustration of FIG. 2. As seen in FIG. 2, the longitudinally extending base member 105 extends along the longitudinal axis L. The base member 105 includes a plurality of longitudinally extending bus bar receiving channels 251, in which a plurality of longitudinally extending bus bars 115 may be positioned, as seen in FIG. 3. The channels 251 each include openings 253 exposing bus bars 115 positioned therein to allow coupling of the bus bars 115 to the interconnect members 110 proximate the interconnect members 110 at a plurality of longitudinal locations $L_0$, $L_0'$, $L_0''$, $L_0'''$, $L_0''''$, $L_0'''''$ along the base member 105. In the particular embodiments shown in FIG. 2, the openings 253 are longitudinally extending openings extending throughout the interconnect module receiving portion 123 (see FIG. 1B) that allow connection of electrical connection members of the interconnect modules 110 to the bus bars 115 at any location in the interconnect module receiving portion 123.

Figure 4:
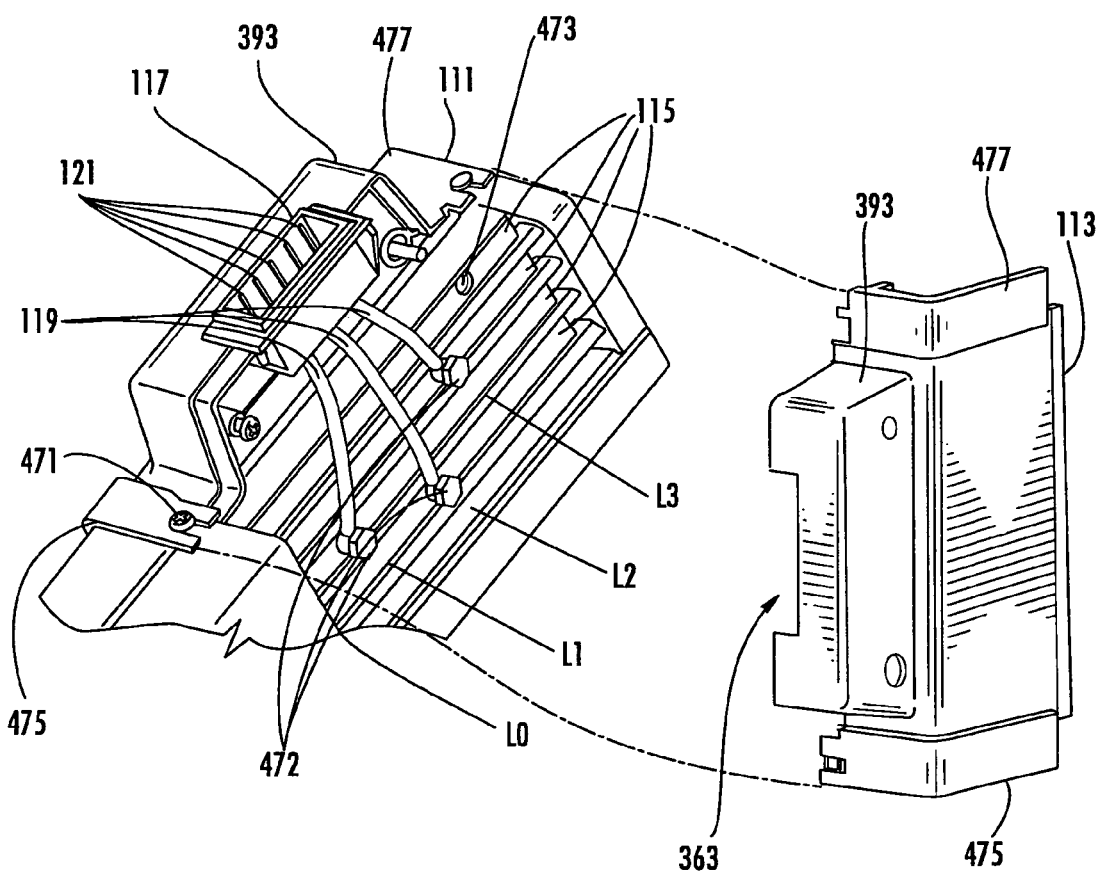
FIG. 4 is a partially exploded view of an interconnect module coupled to a plurality of bus bars according to some embodiments of the present invention.

For the embodiments of the base member 105 illustrated in FIG. 2, the base member 105 further includes a longitudinally extending interconnect module receiving member 255. The interconnect module receiving member 255 includes a longitudinally extending mounting channel 257 on a face thereof. As seen in FIG. 1B and FIG. 4, the interconnect modules 110 may be mounted to the base member 105 by screw members 471 received in and engaging the mounting channel 257. The mounting channel 257 in some embodiments extends through the interconnect module receiving portion 123 to allow the interconnect modules to be mounted at selectable longitudinal locations $L_0$, $L_0'$, $L_0''$, $L_0'''$, $L_0''''$, $L_0'''''$ (see FIG. 1A).

As further seen in the embodiments of the base member 105 illustrated in FIG. 2, the base member 105 includes a rack mounting wall portion 259 and a bus bar receiving portion 254, including the bus bar receiving channels 251, extending from the rack mounting wall portion 259. The rack mounting wall portion 259 includes interconnect module receiving channels 252, 252' on respective first and second ends thereof. The receiving channels 252, 252' are configured to receive ends 135, 135' of the interconnect modules 110 coupled to the base member 105 as seen in FIG. 3. The bus bar receiving portion 254 has an end portion 254a, displaced from the rack mounting wall portion 259, that includes the mounting channels 257 therein and defines the interconnect module receiving member 255.

In some embodiments of the present invention, the base member 105 is an extruded polymeric member. For example, the base member 105 may be polystyrene and/or polyphenylene ether. In the particular embodiments shown in FIG. 2, the base member 105 is a longitudinally extending extruded member having uniform cross-sectional shape throughout both the interconnect module receiving portion 123 and through the termination section 130. The length of the base member 105 may be varied and selected to conform with the requirements and dimensions of a power assembly rack in which it will be utilized or the like. Thus, flexibility may be provided, in some embodiments of the present invention, as to both the longitudinal position of the interconnect modules 110 and the number of interconnect modules 110 that may be accommodated, as well as the range of locations over which they may be positioned. Thus, for example, a power interconnect assembly 100 may be sized to extend across a rack, a plurality of racks, or the like, by variations in the length of the base member 105 utilized and a single termination section 130 or multiple termination sections 130 may be provided on a given base member 105. Similarly, a variation in the number of bus bars 115 accommodated in the power interconnect assembly 100 may be provided by variations in the number of channels 251 provided in the base member 105 and/or the number of channels into which a bus bar 115 is inserted.

In the particular embodiments illustrated in FIG. 2 and FIG. 3, eight channels 251 are shown, with four on each side of the receiving portion 254. In the particular embodiments illustrated in FIGS. 2 and 3, two additional bus bars 115 may be accommodated in the channels 282 on each side of the bus bar receiving portion 254. Each of the channels 251 in the embodiments of FIGS. 2 and 3 are defined by respective pairs of partition walls 285. In addition, a thickened retaining tab portion 287 is shown on each of the partition walls 285 that may be used to retain a bus bar 115 snapped into a respective channel 251 through a corresponding opening 253 in the channel 251 or slid through an end of the channel 251.

Also shown in the embodiments of FIGS. 2 and 3 are spacers 289 positioned on a bottom wall of the respective channels 251 extending between the partition walls 285 thereof. The spacers 289 may serve to position the bus bars 115 displaced from the back wall. Such an arrangement may facilitate cooling of the bus bars 115 by allowing increased airflow to pass along a back face of the respective bus bars 115 in the channels 251.

As best seen in FIG. 3, the first L-shaped member 113 extends from a first end 135 positioned in a first 252 of the receiving channels of the rack mounting wall portion 259 to a second end 137 adjacent the interconnect module receiving member 255 and extending over the mounting channel 257. The second L-shaped member 111 extends from a first end 135' positioned in the other 252' of the receiving channels of the rack mounting wall portion 259 to a second end 137' adjacent the interconnect module receiving member 255 and extending over the mounting channel 257 with the first L-shaped member 113 therebetween. The connector receiving opening 363 is positioned over the mounting channel 257 and is defined by the overlapping first 113 and second 111 L-shaped members and is configured to receive the connecting member 117. The first 113 and second 111 L-shaped members may be, for example, a polymer such as polystyrene and/or polyphenylene ether (e.g., Noryl®).

An additional feature shown in the embodiments illustrated in FIGS. 2 and 3 is a snap lock arrangement for coupling the respective L-shaped members 111, 113 to the base member 105 so as to provide the enclosed cavity 361 surrounding the bus bars 115. In particular, each of the interconnect module receiving channels 252, 252' includes a corresponding lock tab 283, 283' configured and positioned to cooperate with respective lock tabs 135a, 135a' located on the ends 135, 135' of the L-shaped members 111, 113.

For some embodiments of the present invention, as best seen in FIG. 3, each of the L-shaped members 111, 113 includes an extension portion 393 thereon which, once positioned as shown in FIG. 3, define an opening 363 configured to receive the connector member 117. The extension portions 393 further define an enclosed volume 395 in which electrical connections, such as wiring and the like, may be arranged. FIG. 3 also illustrates an overlap portion 391 formed by the overlapping ends portions 137, 137' of the respective L-shape members 111, 113. Note that the cross-sectional illustration of FIG. 3 includes this overlap portion 391 and the opening 363. However, it will be understood that the cross-sectional view of FIG. 3 is not on a straight line in this region with respect to the line 3-3 of FIG. 1A as an opening, rather than an overlap, would extend from the volume 395 into the cavity 361 to allow passage of linking electrical connector members 119 (FIG. 4) between a connector member 117 in the opening 363 and respective ones of the bus bars 115 to provide a desired connection arrangement for the connector member 117. However, the overlapping portions of the ends 137, 137' are shown, nonetheless, in the cross-sectional view of FIG. 3 for illustrative purposes.

Referring now to FIGS. 1B and 4, the power interconnect assembly 100 in the illustrated embodiments includes a plurality of linking electrical connection members 119 coupling ones of a plurality of electrical connectors 121 of the connector member 117 to corresponding ones of the plurality of bus bars 115. The connection members 119 are shown as coupled to respective bus bars 115 by a connector member, such as a bolt 472 engaged in a threaded opening 473 formed in the bus bar at a location proximate the connector member 117. The linking electrical connection members 119 allow the electrical connectors 121 of the connector member 117 to be selectively coupled to designated ones of the plurality of bus bars 115 to define a connection arrangement between the connector member 117 and the bus bars 115. Different ones of the interconnect modules 110 and the respective connector members 117, in some embodiments, may include a connection arrangement between the connector members 117 and the bus bars 115 that differs between the respective connector members 117. Nonetheless, the connector members 117 themselves may have a same form factor across different interconnect modules 110. In some embodiments, the form factor is a fingerproof connector, such as fingerproof power pole pack connectors available from Anderson Power Products.

As seen in the embodiments of FIG. 1A and FIG. 4, respective ones of the interconnect modules 110 are coupled to the base member 105 at selectable longitudinal locations $L_0, L_0', L_0'', L_0''', L_0'''', L_0'''''$. In each of the respective locations, such as illustrated for the location Lo in FIG. 4, the linking electrical connection members 119 couple the connector members 117 to the bus bars 115 at locations $L_1, L_2, L_3$ proximate the respective longitudinal locations $L_0, L_0'', L_0''', L_0'''', L_0''''', L_0''''''$.

The connector 117 may have a keying arrangement in some embodiments of the present invention restricting what profile corresponding pluggable connectorized cable from a power component may be received in the keyed connector member 117. Different ones of the connector members 117 may have different keying arrangements so that a first of the connector members 117 may block insertion of a pluggable connectorized cable keyed to a second of the connector members 117 and the second connector member 117 may block insertion of a pluggable connectorized cable keyed to the first connector member 117.

As also seen in FIG. 1B and FIG. 4, a self tapping screw member 471 may be used extending through the first 113 and second 111 L-shaped members and into the mounting channel 257 to couple the first 113 and second 111 L-shaped members to the base member 105. Such an arrangement may be utilized to allow flexible positioning of the connector member 117 and interconnect module 110 at any desired selectable longitudinal location along the interconnect module receiving portion 123 of the interconnect assembly 100.

As seen in FIG. 1A, the interconnect modules 110, alone or in combination with the spacer members 125, may be arranged in an abutting relationship at respective longitudinal locations along the base member 105. The interconnect modules 110 may abut each other or may abut a spacer member 125 positioned therebetween. As seen in FIG. 4, respective mating portions 475, 477 may be provided on the interconnect modules 110 to allow for an interleaved an overlapping relation between adjacent interconnect modules 110 and/or spacer members 125 so as to define the cavity 361 enclosing the bus bars 115.

Figure 5:
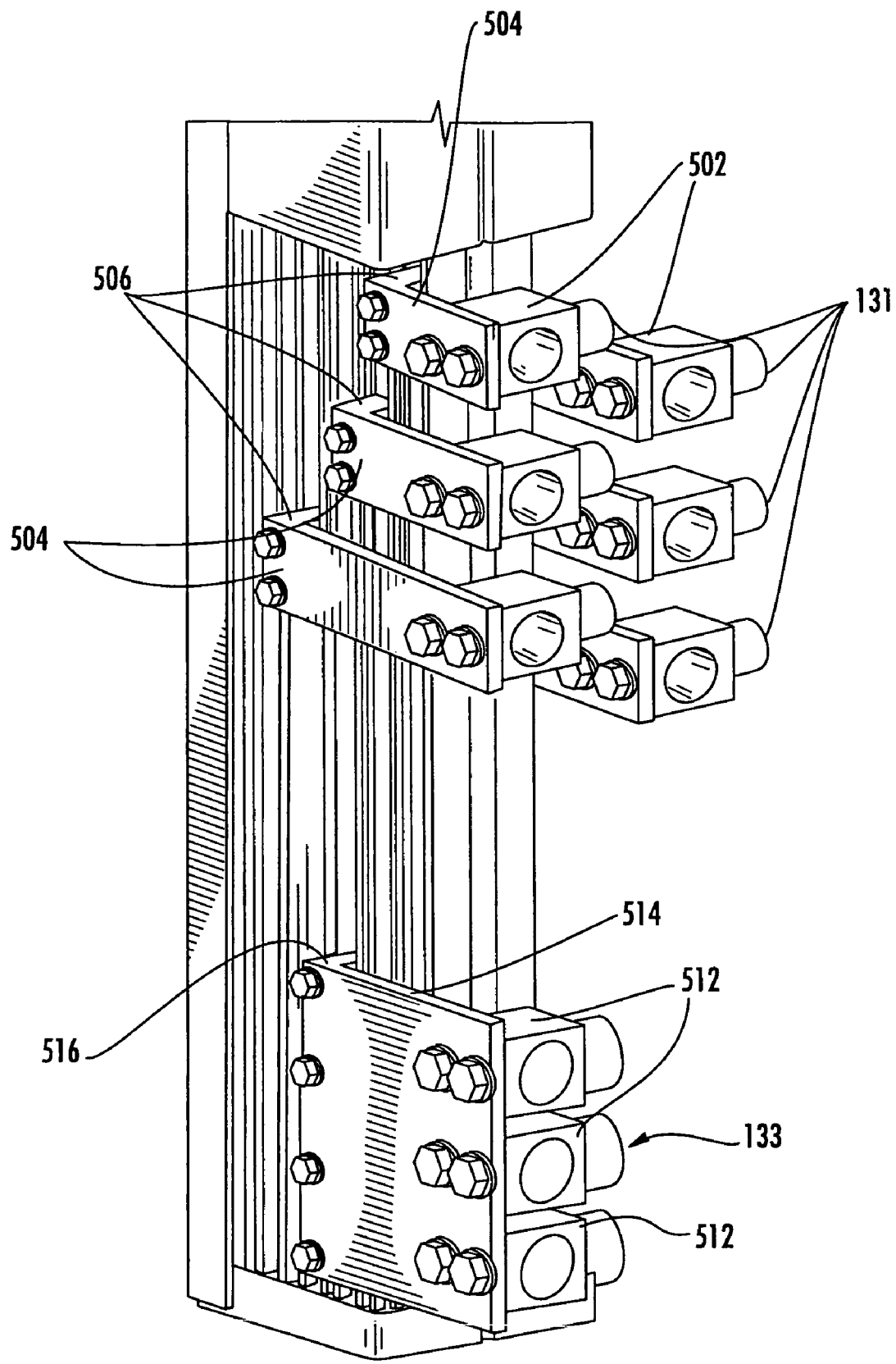
FIG. 5 is a perspective view of a power interconnect assembly termination section according to some embodiments of the present invention.
Figure 6A:
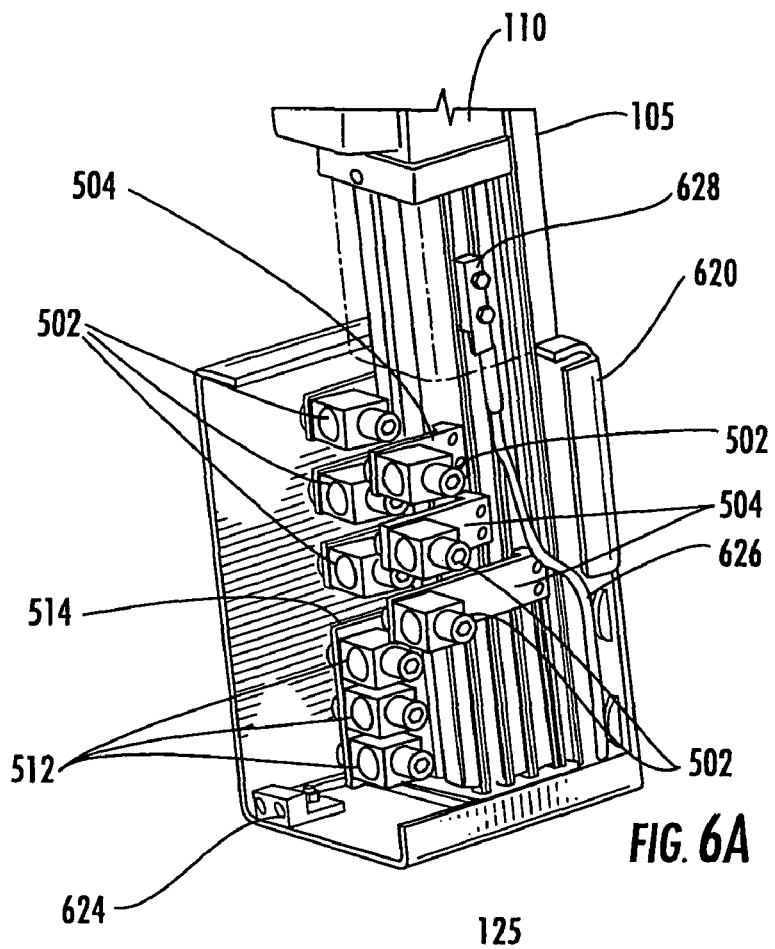
FIGS. 6A and 6B are perspective views of a power interconnect assembly termination section according to some embodiments of the present invention.
Figure 6B:
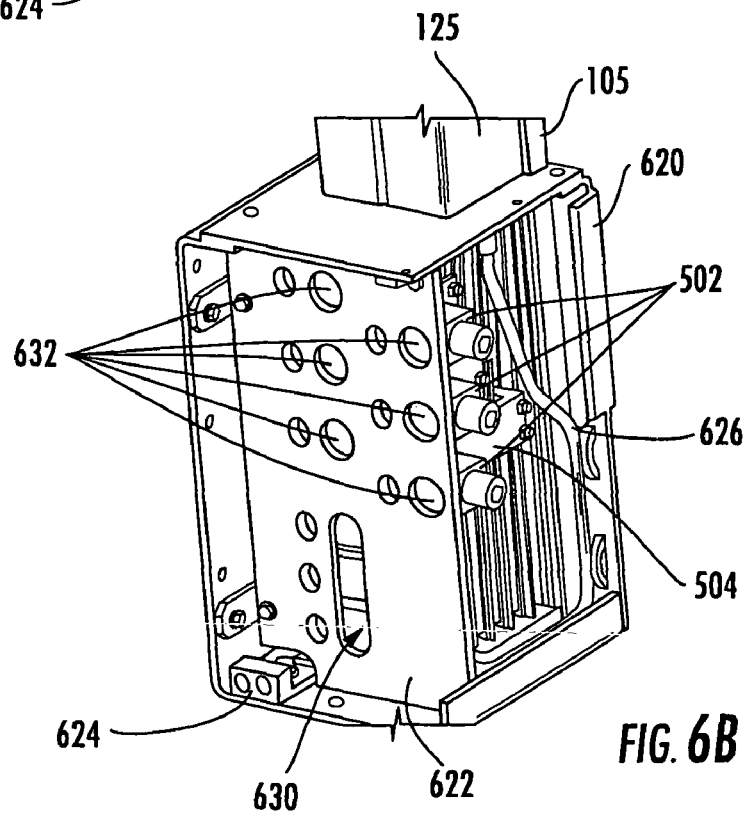

Arrangements according to some embodiments of the present invention suitable for use in the termination section 130 will now be further described with reference to the illustrations of FIG. 5, 6A and 6B. As shown in FIGS. 5, 6A and 6B, a plurality of input connectors 131, 133 are included in the terminated section 130 that are coupled to respective ones of the bus bars 115. The input connectors 131 are shown arranged to provide connection of an input cable or the like to a respective associated single one of the bus bars 115, including providing a cable connection portion 502 coupled by respective different length bridging members 504 to the bus bar connector portion 506.

As shown in the arrangement of FIGS. 5, 6A and 6B, the variable length of the bridging members 504 may allow for positioning of each of the cable connection portions 502 along a common plane, while connecting the respective connectors 131 to different ones of the bus bars 115 in a one-to-one relationship. A bridging member 514 allows connection of multiple layer cable connection portions 512 to a same one of the bus bars 115 through a bus bar connecting portion 516 extending from the common bridging member 514. Thus, with the arrangement of FIG. 5, multiple input/output lines may be coupled to a single bus bar 115 using the connectors 133, while other ones of the bus bars 115, six of them as shown in FIG. 5, may be connected to separate single input lines.

As seen in FIGS. 6A and 6B an eighth of the bus bars 115 may be separately connected to using a wire bus bar connection member 628 having a cable 626 extending therefrom to an input connector 624. For example, the bus bar 115 coupled to by the connector 628 may provide a neutral reference coupled through the input connector 624 in some arrangements.

As also seen in FIG. 6A and 6B, the termination section 130 may include a protected housing member 620 around the input connectors 131, 133, 624. A protective plate 622 may be coupled to the housing 620. The plate 622 may include openings 632 for receiving input wires coupled through the connectors 131 and an opening 630 receiving wires coupled through the input connectors 133. The plate 622 further is shown as including a cut-out for the input connector 624.

Figure 7A:
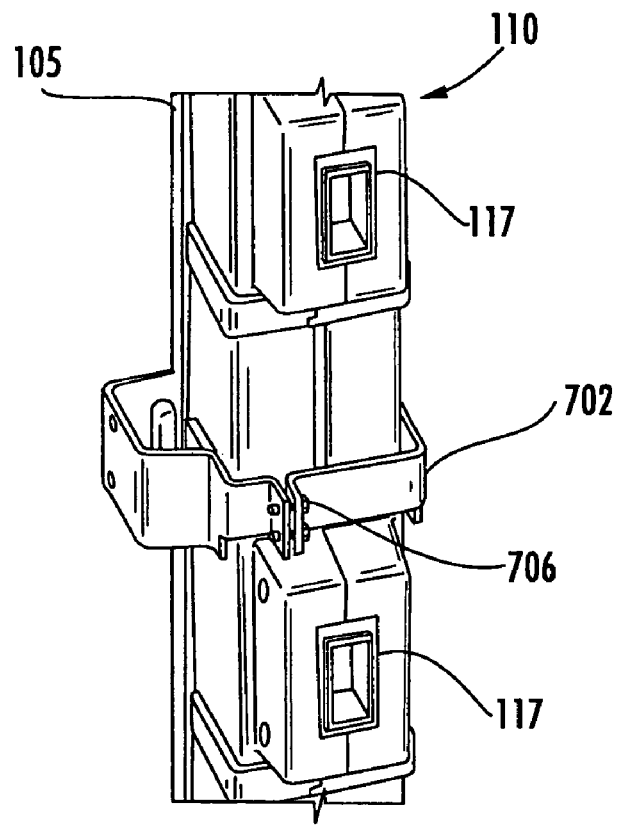
FIGS. 7A and 7B are perspective views of a bracket for a power interconnect assembly according to some embodiments of the present invention.
Figure 7B:
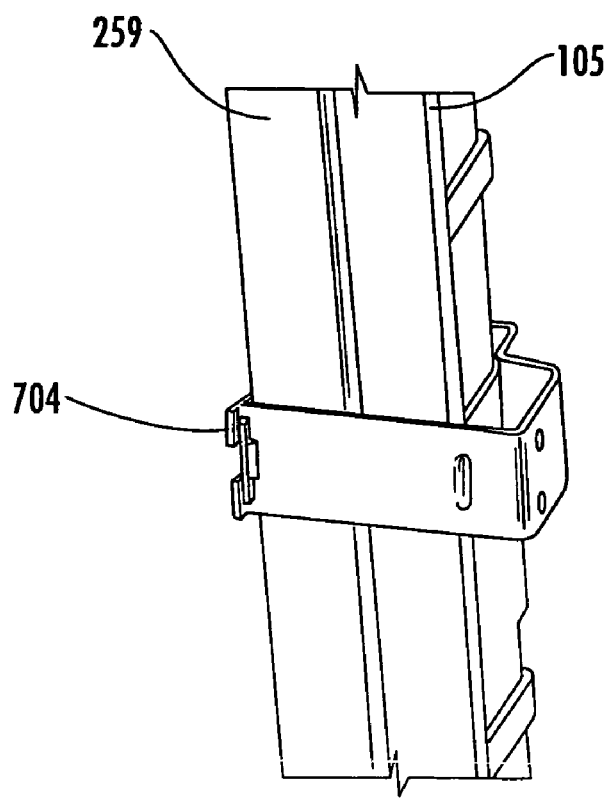

Referring now to FIGS. 7A and 7B, an interconnect module 110 may include a plurality of connector members 117 therein. The connection arrangement between ones of the connector members 117 and the bus bars 115 may differ for respective ones of connector members 117 of an interconnect module 110 and the respective connector members 117 may have the same form factor as seen in FIG. 7A.

Also illustrated in the embodiments of FIG. 7A and 7B is a bracketing arrangement that may be used to couple a power interconnect assembly 100 to a rack of a power assembly or the like. A two part bracket 702 is shown in FIG. 7A and 7B extending around the power interconnect assembly 100. The respective halves of the bracket 702 are coupled at one end through interlocking portions 704 and another end by connector members 706 so as to be wrapped around a power interconnect assembly 100 and coupled thereto. The bracket 702 may be arranged to have a face thereof configured to mate with a corresponding receiving channel, bracket or the like positioned in a power supply rack. A plurality of brackets 702 may be used for coupling a power interconnect assembly 100 to a rack of a power assembly or the like. Once in the rack, respective ones of the power components may be coupled to the corresponding interconnect module 110 and connector members 117 having the desired connection arrangement to the bus bars 115 for the respective power components.

Figure 8:
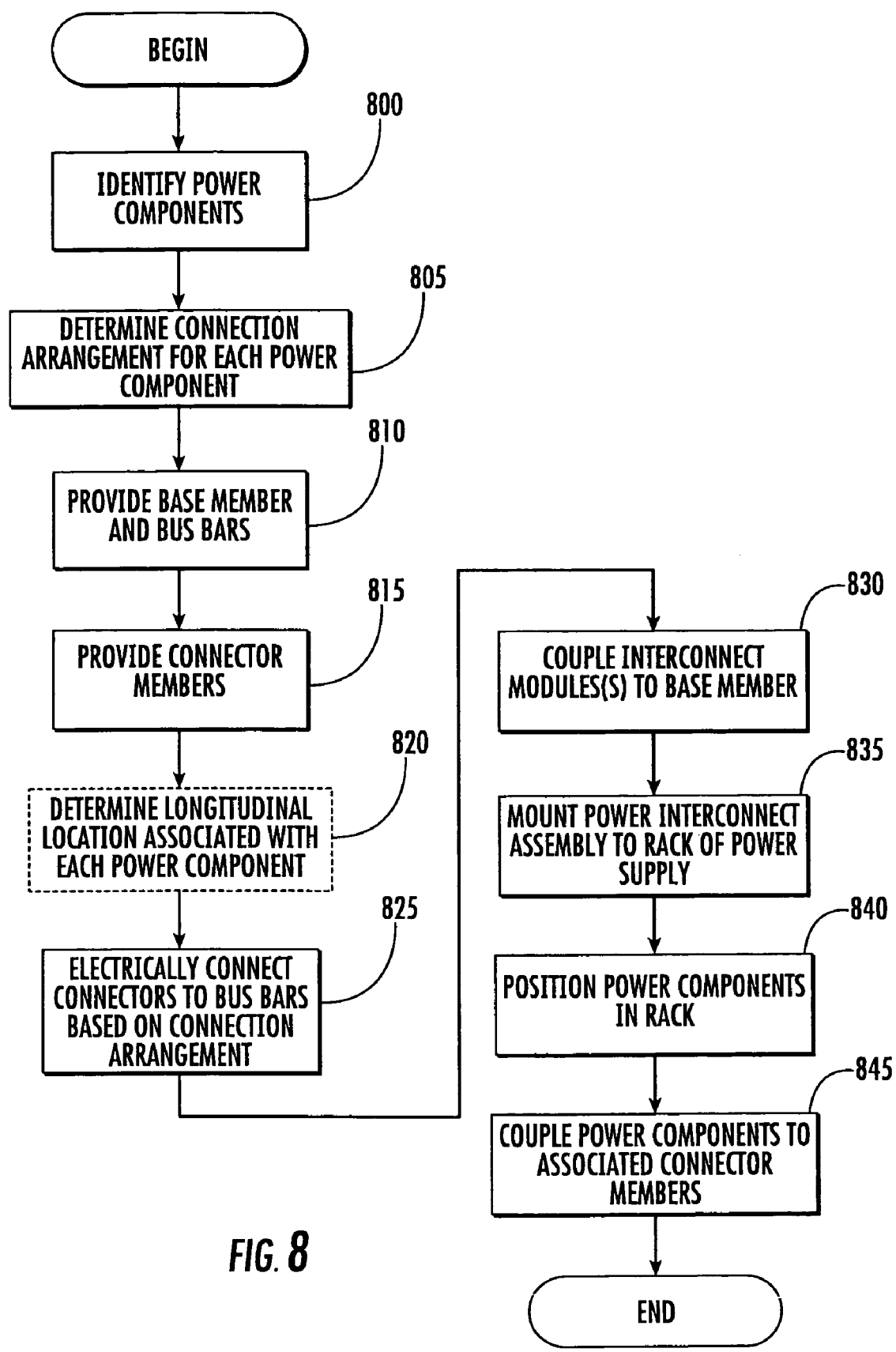
FIG. 8 is a flow chart illustrating operations for configuring a power interconnect assembly for use in a power supply according to some embodiments of the present invention.

Referring now to FIG. 8, methods of configuring a power interconnect assembly 100 for use in a power supply having associated electrical bus connections, according to some embodiments of the present invention, will now be further described. As illustrated in the embodiments of FIG. 8, a plurality of power components of the power supply are identified (block 800). A connection arrangement for each of the plurality of power components to the electrical bus connections are determined (block 805).

A longitudinally extending base member, including a plurality of bus bars therein corresponding to respective ones of the electrical bus connections, is provided (block 810). In addition, a plurality of connector members, each of the connector members being configured to receive a pluggable connectorized cable from a power component, are provided (block 815). Each of the connector members provided at block 815 has a plurality of electrical connectors at defined positions therein. In some embodiments of the present invention, as illustrated at block 820, a longitudinal location associated with each of the plurality of power components is also determined.

Ones of the electrical connectors are electrically connected to corresponding ones of the bus bars based on the determined connection arrangement of respective ones of the power components to be associated with the connector member (block 825). An interconnect module is coupled to the base member for each of the plurality of power components with the associated connector member positioned therein to provide a configured power interconnect assembly covering the bus bars (block 830). The respective interconnect modules and connector members may be positioned on the base member at determined longitudinal locations for the associated power component members in embodiments where the power components are determined to have associated longitudinal locations at block 820.

In some embodiments of the present invention, operations further include mounting the configured power interconnect assembly to a rack of the power supply (block 835). The plurality of power components are positioned in the rack (block 840). Respective ones of the power components are coupled to their associated connector members in the power interconnect assembly using pluggable connectorized cables extending from their respective ones of the power components (block 845).

According to various embodiments of the present invention, power interconnect assemblies along the lines described above with reference to FIGS. 1-8 may be used to support modular UPS systems and electronic systems including such UPS system that have a variety of flexible "plug and play" configurations. In particular a UPS system may include a plurality of UPS system component modules, such as UPS modules, battery modules, power distribution modules, and the like.

Each may be configured to be arranged in one or more equipment racks and may include at least one flexible power cable extending therefrom and a pluggable connector at an end thereof. The UPS system may further include a modular power interconnect assembly, e.g., an assembly configured along the lines of the assemblies described above. The power interconnect assembly may be attached to the one or more equipment racks in a number of different ways, as described in further detail below. Respective ones of the connectors of the UPS system component modules are pluggably mated with respective ones of connectors of the power interconnect assembly such that the power interconnect assembly provides electrical interconnection among the plurality of UPS system component modules.

In further embodiments, such UPS system components may be integrated with load modules in equipment racks. For example, UPS modules and/or other UPS system component modules, such as battery modules, transformer modules, switch modules, and power distribution unit (PDU) modules, may be arranged in one or more equipment racks that also house loads, such as servers, routers, hubs and other data processing and/or data communications equipment. The UPS modules and/or other UPS system components may be configured to provide power to such loads. The UPS system component modules may be interconnected using one or more modular power interconnect assemblies along lines described herein to provide, among other things, input power paralleling, output power paralleling, battery power distribution and the like among the UPS system component modules.

Figure 9:
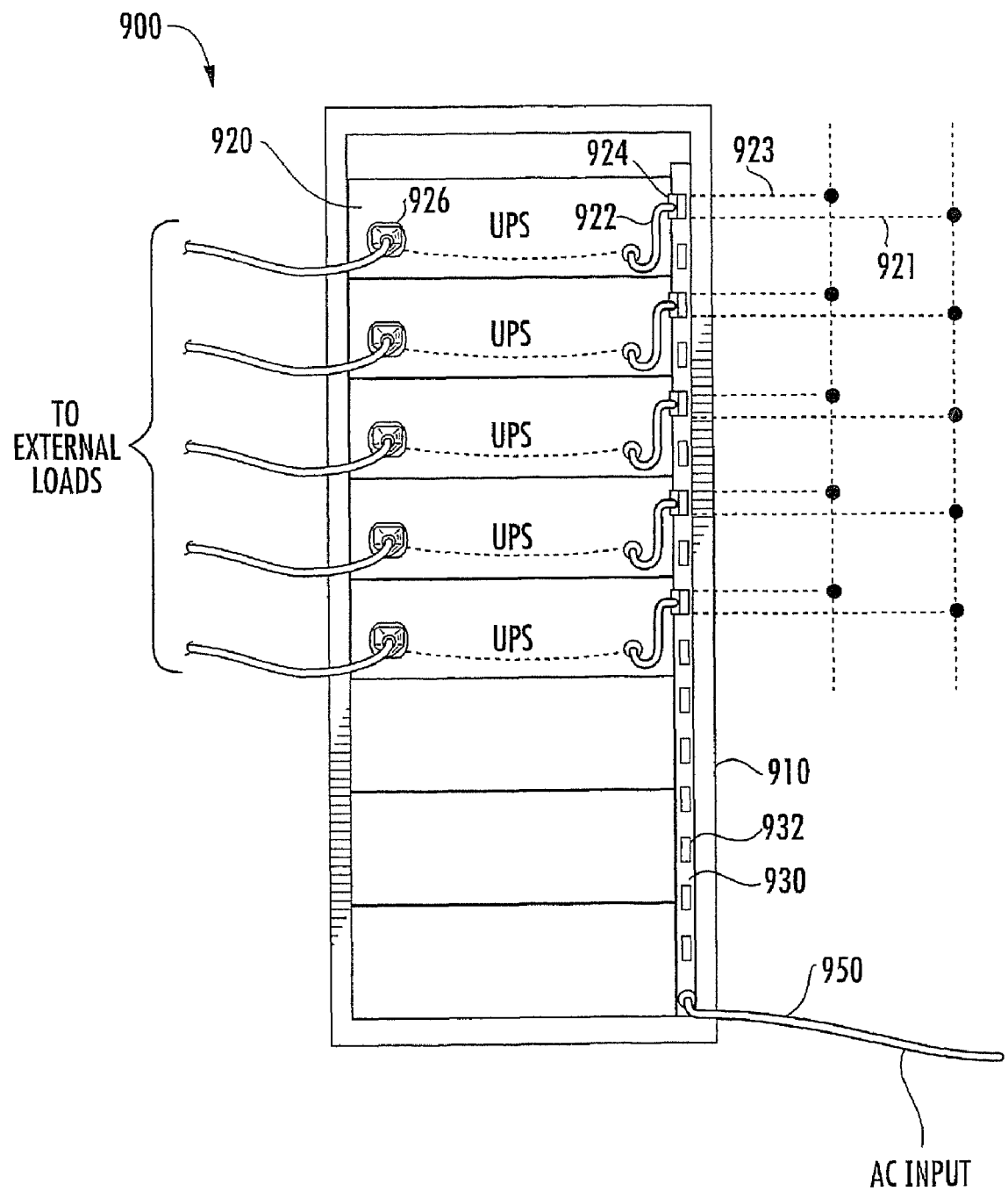
FIG. 9 illustrates a UPS system including a plurality of UPS modules according to some embodiments of the present invention.

FIG. 9 illustrates a modular UPS system 900 according to some embodiments of the present invention, more particularly, an example of how a modular power interconnect assembly may be used to support paralleling of UPS system components. The system 900 includes an equipment rack 910, e.g., a standard 19-inch or similar rack. A plurality of UPS system component modules, here shown as including a plurality of UPS modules 920, is arranged in a columnar fashion in the rack 910. The UPS modules 920 may include any of a number of different types of UPSs, for example, on-line, standby, line-interactive or other types of UPSs. Each UPS module 920 has a flexible power cable 922 extending therefrom and terminating with a connector 924. In the illustrated embodiments, each UPS module 920 further includes at least one power outlet 926 that is configured to be connected to external loads.

The system 900 further includes a modular power interconnect assembly 930 that is attached to the equipment rack 910. The power interconnect assembly 930 may have a configuration along the lines described above with reference to FIGS. 1-8, i.e., may include an elongate housing with a plurality of substantially parallel bus bars running along a length thereof, with connectors 932 positioned at a face of the housing and spaced along the length of the housing. The power interconnect assembly 930 may be attached or otherwise mounted in and/or on the equipment rack using, for example, the mounting configuration described above.

As further shown in FIG. 9, the power interconnect assembly 930 may be configured to support parallel interconnection of the UPS modules 920 when the connectors 924 of the power cables 922 of the UPS modules 920 are pluggably mated with the connectors 932 of the power interconnect assembly 930. In particular, as shown in dashed line, power inputs 921 of the UPS modules may be parallel connected by common connection to a bus bar(s) in the power interconnect assembly 930. The power inputs 921 may be fed, for example, from an AC input cable 950 attached at or near a bottom end of the power interconnect assembly 230.

Similarly, power outputs 923 of the UPS modules 920 may be parallel connected by, for example, common connection to another bus bar(s) of the power interconnect assembly 930. As shown, the parallel connected power outputs 923 may also be electrically coupled to the power outlets 926 of the UPS modules 920 that serve external loads. It will be appreciated that, in this manner, the UPS modules 920 may operated in a parallel redundant manner such that, for example, a load coupled to a given one of the UPS modules 920 may be served by one or more of the other UPS modules 920 in event of failure of the given UPS module 920. It will be appreciated that, although FIG. 9 illustrates provision of power to external loads via outlets 926, other embodiments of the present invention may connect to loads in other ways. For example, loads may be connected via the power interconnect assembly 930 (or another such assembly), e.g., a power cable may be connected to output power bus bars of the power interconnect assembly 930 and fed to a power distribution (PDU) module positioned in the same rack or in another rack that provides for connection of loads. For example, a modular power interconnect assembly, e.g., the assembly 930, may support connection between the UPS modules 920 and a power distribution rack that serves rackmounted loads as described in a copending U.S. Pat. No. 7,542,268, entitled "Modular Electronic Systems and Methods using a Flexible Power Distribution Interface," filed concurrently herewith and incorporated herein by reference in its entirety.

The power interconnect assembly 930 may support additional connections. For example, in some embodiments of the present invention, the UPS modules 920 may have internal batteries, and the power interconnect assembly 930 may include bus bar connections to support provision of DC busses therein, such that the batteries of the UPS modules 930 may be parallel interconnected in a manner similar to the power input and output connections shown in FIG. 9. The power interconnect assembly 930 (or an additional, similar power interconnect assembly mounted, for example, in parallel with the power interconnect assembly 930) may be configured to support an external battery connection, similar to the AC input 950 shown in FIG. 9. Such an external battery connection may be used, for example, to connect to an external battery that serves the UPS modules 920. It will be appreciated that such an external DC connection may be used for UPS modules that do not have internal batteries, or to supplement battery power for UPS modules that do include internal batteries.

It will be further understood that a configuration along the lines described with reference to FIG. 9 may be used with other types of UPS system component modules. For example, in some embodiments of the present invention, a battery rack may have a modular construction similar to that shown for the UPS modules 920 of FIG. 9, wherein, instead of a column of UPS modules 920, a rack includes a columnar arrangement of battery modules that are interconnected by a power interconnect assembly having a form factor similar to the power interconnect assembly 930. In other embodiments, UPS modules and battery modules may be arranged together in a single rack in a similar manner, and interconnected using a power interconnect assembly having a form factor similar to the power interconnect assembly 930. Such a rack may further include other types of modules, such as transformer or switch modules that may be similarly interconnected.

Figure 10:
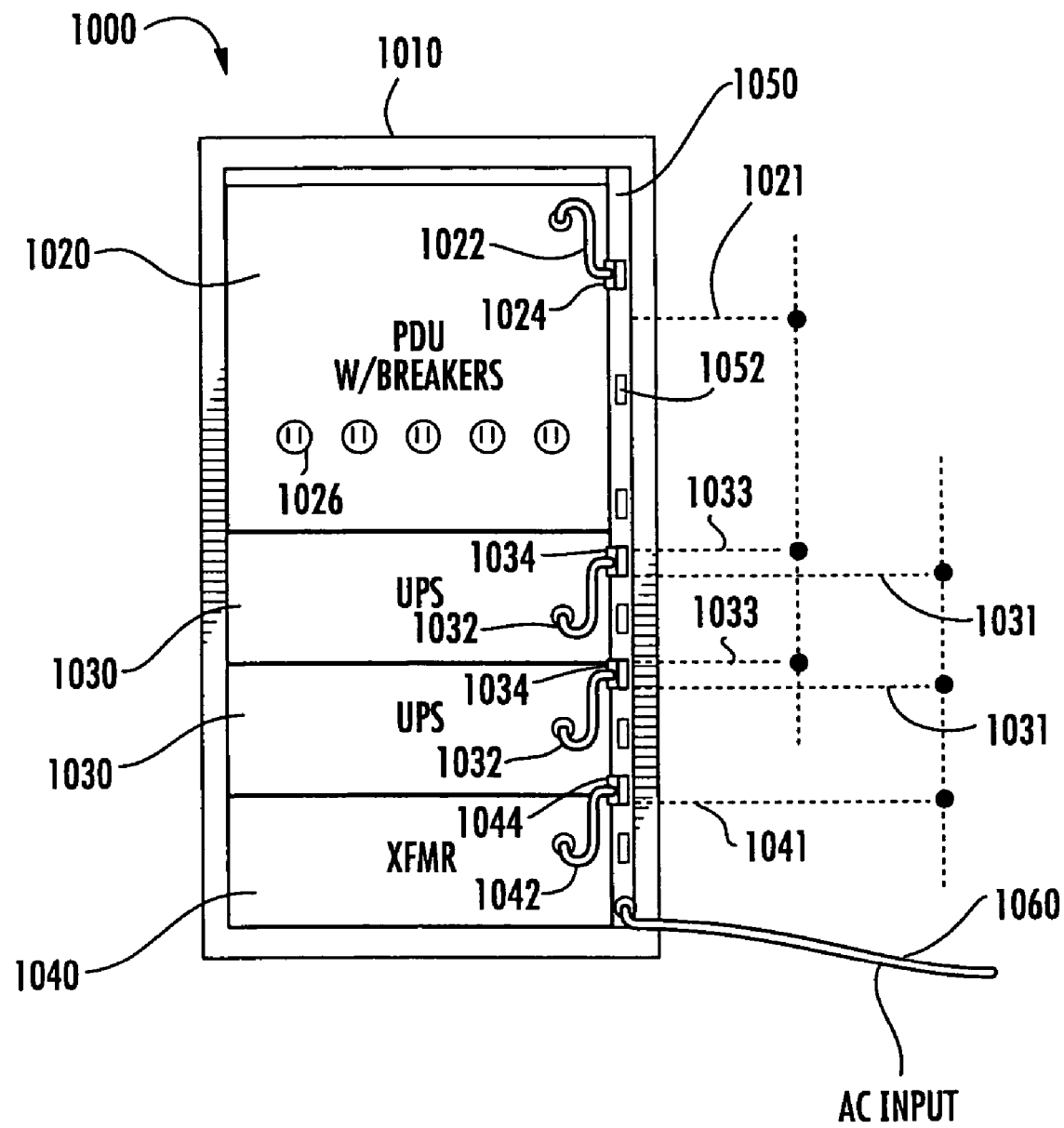
FIG. 10 illustrates a UPS system including a variety of UPS system component modules according to further embodiments of the present invention.

In further embodiments, a similar approach may be used to interconnect other types of UPS system component modules in a single equipment rack. In particular, FIG. 10 illustrates another exemplary UPS system 1000 according to further embodiments of the present invention wherein two UPS modules 1030, a transformer (xfmr) module 1040 and a power distribution unit (PDU) module 1020 are arranged in a columnar fashion in an equipment rack 1010. The modules 1020, 1030, 1040 have respective power cables 1022, 1032, 1042 extending therefrom and terminating in respective connectors 1024, 1034, 1044.

An elongate power interconnect assembly 1050 is mounted vertically in the equipment rack 1010, extending along the column of modules 1020, 1030, 1040. The power interconnect assembly 1050 includes a plurality of connectors 1052 spaced along a face thereof. As shown in dashed line, the power interconnect assembly 1050 provides parallel connection of power inputs 1031 of the UPS modules 1030 with a power output 1041 of the transformer module 1040, e.g., by common connection to a bus bar(s) the power interconnect assembly 1050. The power interconnect assembly 1050 also supports parallel interconnection of power outputs 1033 of the UPS modules 1030 with a power input 1021 of the power distribution module 1020. The transformer module 1040 may be fed from an AC input 1060 to the power interconnect assembly 1050.

It will be understood that the configuration of modules shown in FIG. 10 is an illustrative example, and that other embodiments of the present invention may include other collections and arrangements of UPS system component modules. For example, a multi-module arrangement such as that shown in FIG. 10 could include modules, such as bypass switch and battery modules, in addition to the UPS, transformer and PDU modules shown. Interconnection among these modules may be provided using one or more pluggable power interconnect assemblies similar to the power interconnect assembly 1050 shown in FIG. 10.

Figure 11:
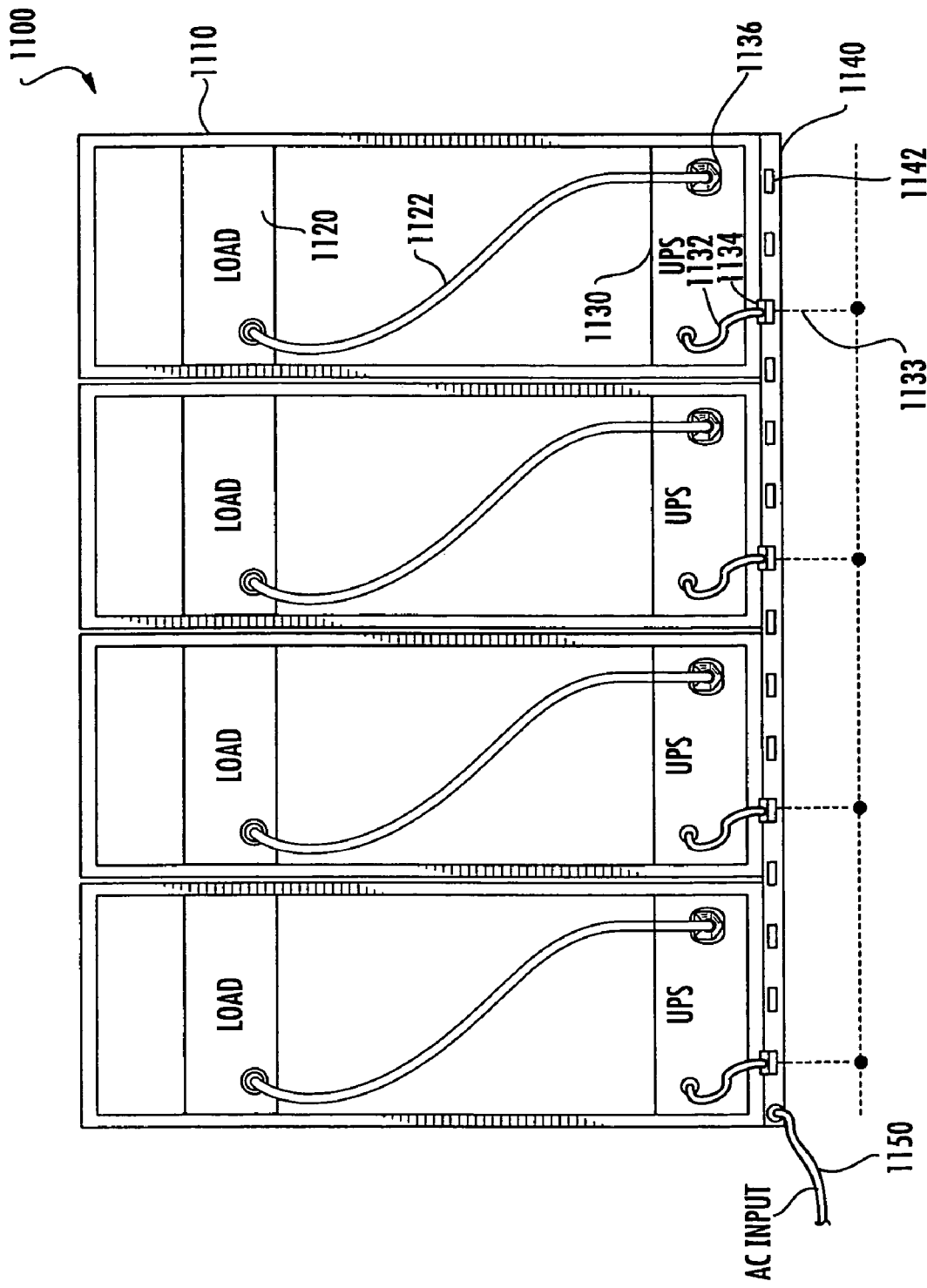
FIG. 11 illustrates an electronic system incorporating UPS system component modules in a row of equipment racks according to additional embodiments of the present invention.

According to further embodiments of the present invention, a power interconnect assembly along the lines discussed above may also support a horizontal arrangement in a row of equipment racks. Referring to FIG. 11, a system 1100 according to some embodiments of the present invention includes a plurality of UPS modules 1130 that are arranged in a horizontal row in a row of equipment racks 1110. An elongate power interconnect assembly 1140 is attached to the plurality of equipment racks 1110. As shown, the power interconnect assembly 1140 may be attached along bottom rear faces of the racks 1110 using, for example, clamps, mounting brackets or other mountings. It will be appreciated, however, that the power interconnect assembly 1140 may be mounted in other locations, for example, along top portions of the back faces of the racks 1110 and/or on top of the racks 1110.

The power interconnect assembly 1140 may provide parallel interconnection of the UPS modules 1130. As shown, for example, power outputs 1133 of the UPS modules 1130 may be connected in parallel, e.g., using common connection to a bus bar(s), by the power interconnect assembly 1140 when connectors 1134 of power cables 1132 of the UPS modules 1130 are pluggably mated with connectors 1142 of the power interconnect assembly 1140. Power outlets 1136 of the UPS modules 1130 are electrically connected to the power inputs 1133 and are configured to serve loads 1120, which are also positioned in the equipment racks 1110 via cables 1122. For example, in IT applications, the loads 1120 may include server, router, hub or the computer or data processing and/or communications modules that are powered by the UPS modules 1130. Connections between the loads 1120 and the UPS modules 1130 may be direct, as shown in FIG. 11, and/or may use power strips or other intermediate distribution devices mounted in and/or on the equipment racks 1110. Power inputs of the UPS modules 1130 may also be parallel connected using the power interconnect assembly 1140 (or a similar separate power interconnect assembly), which receives AC power from an AC input 1150. The power interconnect assembly 1140 (or an additional power interconnect assembly) may also support battery interconnection.

Figure 12:
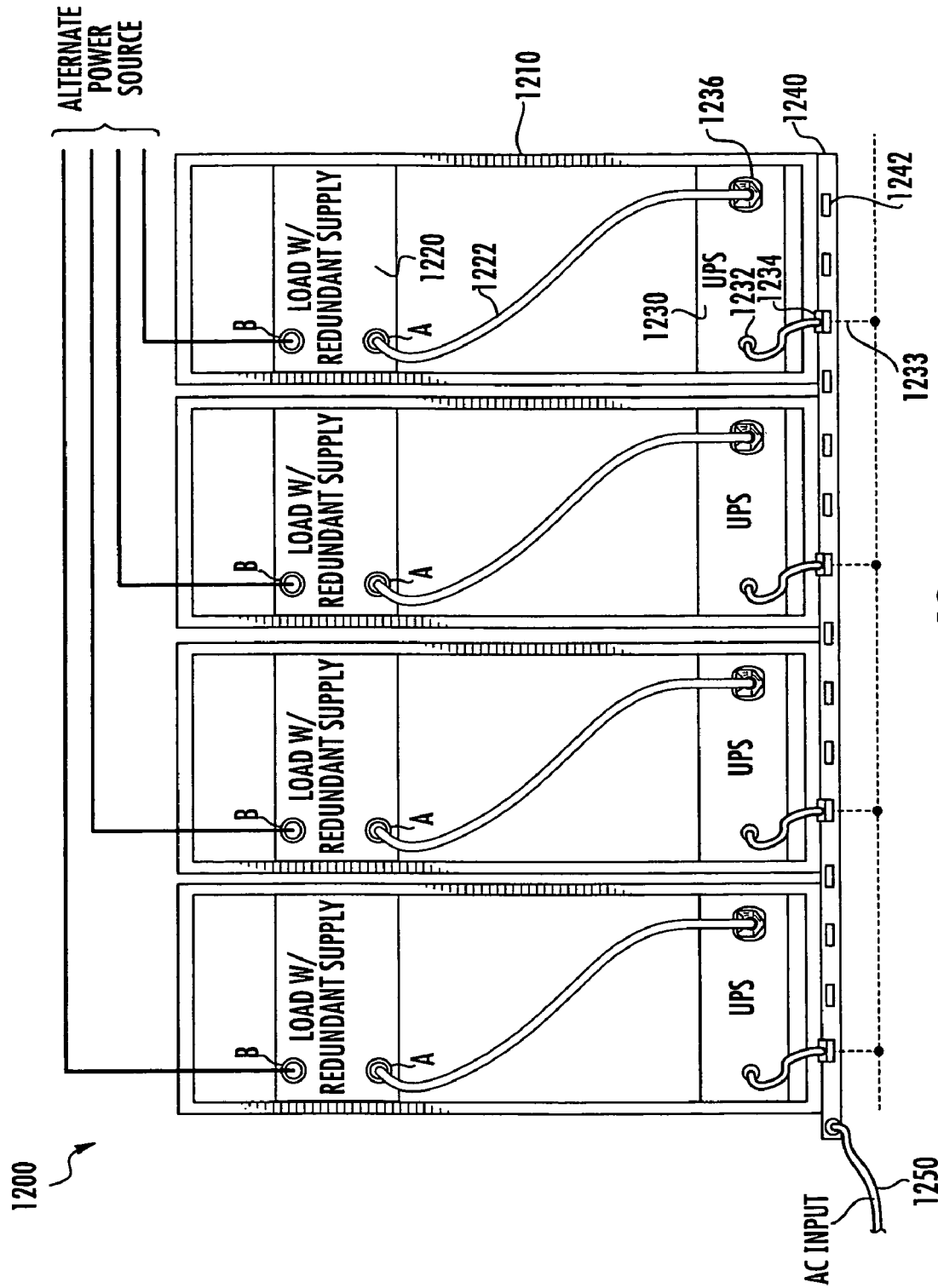
FIGS. 12 and 13 illustrates electronic systems in which modular arrangements of UPS system component modules are configured to supply loads with redundant power inputs.

Some IT applications, such as server rack applications, may involve providing power to rack-mounted loads that are served by redundant power supplies. For example, referring to FIG. 12, which illustrates a system 1200 according to further embodiments of the present invention, loads 1220 arranged in equipment racks 1210 may include first and second power inputs A, B, which feed, for example, redundant DC power supplies of the loads 1220. A row of UPS modules 1230 may be arranged in the racks 1210 in a manner similar to that described above with reference to FIG. 11. In particular, by pluggably mating connectors 1234 of power cables 1232 of the UPS modules 1230 with connectors 1242 of a power interconnect assembly 1240 extending along the row of UPS modules 1230, power outputs 1233 of the UPS modules 1230 may be paralleled via the interconnect assembly 1240. Power outlets 1236 of the UPS modules 1230 are electrically coupled to the power outputs 1233, and to the first power inputs A of the loads 1220 via power cables 1222, thus providing a first power source for the loads 1220. An alternative power source may be coupled to the second power inputs B of the loads 1220. Connections between the loads 1220 and the UPS modules 1230 may be direct and/or may use power strips or other intermediate distribution devices mounted in and/or on the equipment racks 1210. Power inputs of the UPS modules 1230 may also be parallel connected using the power interconnect assembly 1240 (or a similar separate power interconnect assembly), which receives AC power from an AC input 1250. The power interconnect assembly 1240 (or an additional power interconnect assembly) may also support battery interconnection.

Figure 13:
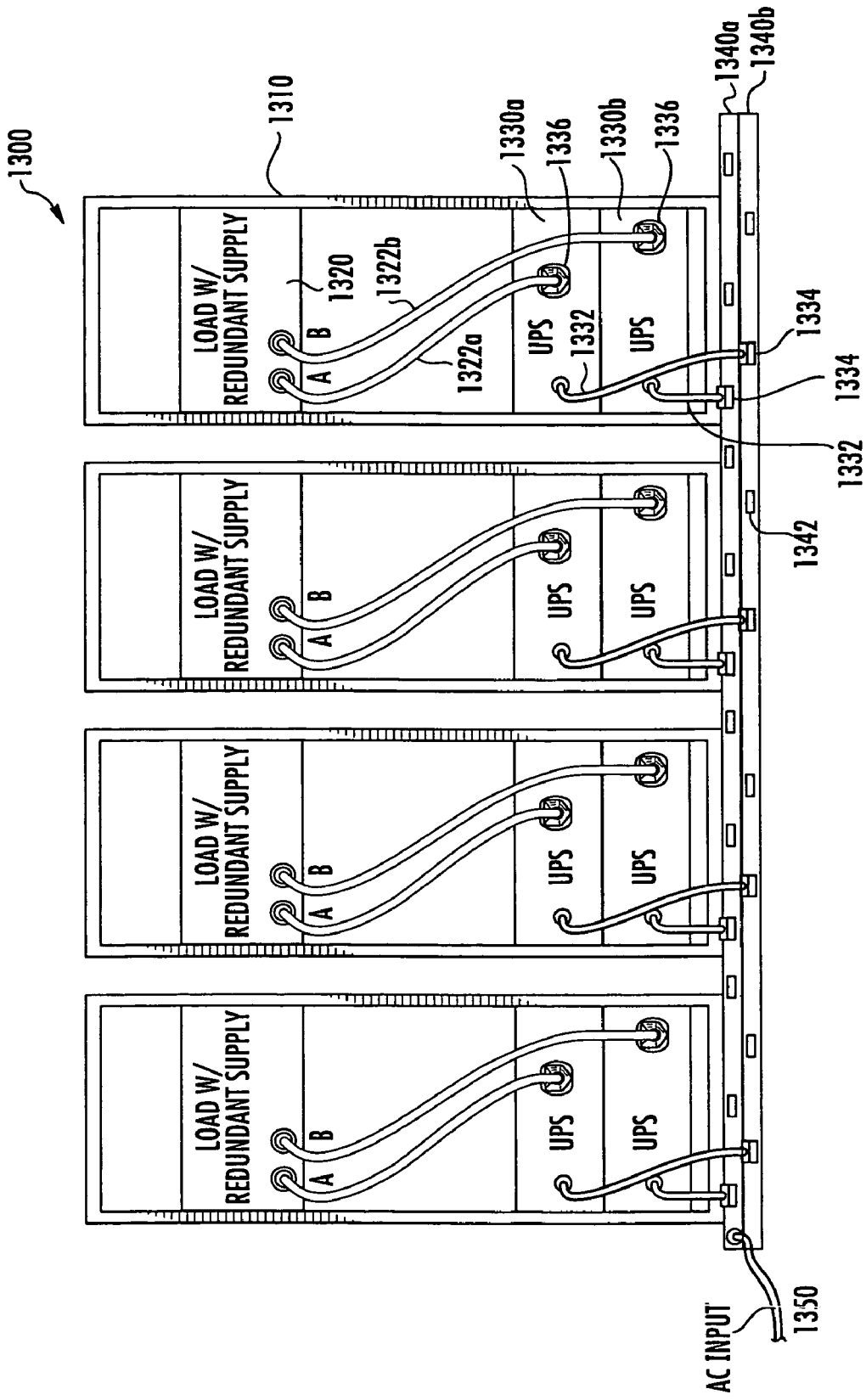

FIG. 13 illustrates an exemplary arrangement for providing power to loads with redundant power inputs. In a system 1300, first and second rows of UPS modules 1330*a*, 1330*b* are arranged in a row of equipment racks 1310, which also house loads 1320 that have redundant first and second power inputs A, B. Connectors 1334 of power output cables 1332 of respective ones of the rows of UPS modules 1330*a*, 1330*b* are pluggably mated with connectors 1342 of respective power interconnect assemblies 1340*a*, 1340*b*. The power interconnect assemblies 1340*a*, 1340*b* provide parallel output interconnections among the UPS modules 1330*a*, 1330*b* of the rows of UPS modules, e.g., along the lines described above with reference to FIG. 12. First power input cables 1322*a* of the loads 1320 are connected to power outlets 1336 of the first row of UPS modules 1330*a*, while second power input cables 1332 of the loads 1320 are connected to power outlets 1336 of the second row of UPS modules 1330*b*. Connections between the loads 1320 and the UPS modules 1330*a*, 1330*b* may be direct and/or may use power strips or other intermediate distribution devices mounted in and/or on the equipment racks 1310. Power inputs of the UPS modules 1330*a*, 1330*b* may also be parallel connected using the power interconnect assemblies 1340*a*, 1340*b* (or a similar separate power interconnect assembly), which may receive one or more AC inputs 1350 (e.g., the assemblies 1340*a*, 1340*b* may be fed from the same power source or from separate power sources). The power interconnect assemblies 1340*a*, 1340*b* (or an additional power interconnect assembly) may also support battery interconnection.

It will be understood that the above-described systems and methods are illustrative examples, and that other arrangements and/or combinations of components fall within the scope of the present invention. For example, systems such as those illustrated in FIGS. 12 and 13 may further include additional other types of UPS system component modules, such as battery, switch, and transformer modules.

In the drawings and specification, there have been disclosed exemplary embodiments of the invention. Although specific terms are employed, they are used in a generic and descriptive sense only and not for purposes of limitation, the scope of the invention being defined by the following claims.

That which is claimed is:

1. A modular uninterruptible power supply (UPS) system, comprising:
   at least one equipment rack;
   a plurality of UPS system component modules arranged in a row or column in the at least one equipment rack, each of the UPS system component modules having at least one flexible power cable extending therefrom and having a pluggable first connector at an end thereof; and
   a modular power interconnect assembly attached to the at least one equipment rack, the modular power interconnect assembly including an elongate housing, a plurality of elongate bus bars positioned within the elongate housing and arranged substantially in parallel and extending along a length of the elongate housing, and a plurality of second connectors positioned at a face of the housing, spaced along the length of the elongate housing, electrically connected to the plurality of bus bars and pluggably mated with respective ones of the first connectors such that the power interconnect assembly provides electrical interconnection among the plurality of UPS system component modules, wherein the power interconnect assembly extends along the row or column of UPS system component modules.

2. The UPS system of claim 1, wherein the UPS system component modules are positioned in a vertical column in a single equipment rack and wherein the power interconnect assembly is mounted vertically in and/or on the single equipment rack.

3. The UPS system of claim 1, wherein the UPS system component modules are positioned in a horizontal row of equipment racks and wherein the power interconnect assembly is mounted horizontally in and/or on the row of equipment racks.

4. The UPS system of claim 1:
   wherein the plurality of UPS system component modules comprises a plurality of UPS modules; and
   wherein the power interconnect assembly provides input and/or output paralleling of the UPS modules.

5. The UPS system of claim 1:
   wherein the plurality of UPS system component modules comprises a plurality of UPS modules;
   wherein the power cables comprise power output cables coupled to power outputs of the UPS modules;
   wherein the power interconnect assembly provides output paralleling of the UPS modules; and
   wherein the UPS modules further comprise power outlets electrically coupled to the power outputs and configured to be electrically coupled to external loads.

6. An electronic system comprising the UPS system of claim 5 and at least one load in the at least one equipment rack, wherein the at least one load is configured to operate redundantly from power supplies at first and second power inputs thereof, and
   wherein respective power outlets of respective first and second ones of the UPS modules are electrically coupled to respective ones of the first and second power inputs of the at least one load.

7. The electronic system of claim 6:
wherein the at least one equipment rack comprises a plurality of equipment racks;
wherein the at least one load comprises a plurality of loads, respective ones of which are positioned in respective ones of the plurality of equipment racks;
wherein respective ones of the plurality of UPS modules are positioned in respective ones of the plurality of equipment racks;
wherein the power interconnect assembly is configured to provide output paralleling of the plurality of UPS modules; and
wherein the outlets of the UPS modules are electrically coupled to the first power inputs of the loads, and wherein the second power inputs of the loads are electrically coupled to an alternative power source.

8. The UPS system of claim 1:
wherein the plurality of UPS system component modules comprises a power distribution module and a UPS module;
wherein the power cables comprise a first power cable coupled to a power output of the UPS module and a second power cable coupled to a power input of the power distribution module; and
wherein the power interconnect assembly electrically interconnects the power output of the UPS module and the power input of the power distribution unit.

9. The UPS system of claim 8, wherein the plurality of UPS system component modules further comprises a transformer module, wherein the power cables further comprise a third power cable coupled to the transformer module and a fourth power cable coupled to the UPS module, and wherein the power interconnect assembly electrically interconnects the transformer module and the UPS module.

10. The UPS system of claim 1, wherein the UPS system component modules and/or the power interconnect assembly is configured to be attached to standardized rack mounting points.

11. The UPS system of claim 1, wherein the plurality of UPS system component modules comprises a UPS module, a battery module, a transformer module, a switch module, and/or a power distribution unit (PDU) module.

12. A method comprising:
arranging a plurality of UPS system component modules in a row or column in at least one equipment rack, each of the UPS system component modules having at least one flexible power cable extending therefrom and having a pluggable first connector at an end thereof;
mounting a modular power interconnect assembly in and/or on the at least one equipment rack, the power interconnect assembly comprising an elongate housing, a plurality of elongate bus bars positioned within the elongate housing and arranged substantially in parallel and extending along a length of the elongate housing, and a plurality of second connectors positioned at a face of the housing, spaced along the length of the elongate housing, electrically connected to the plurality of bus bars and configured to pluggably mate with the first connectors, wherein mounting the modular power interconnect assembly in and/or on the at least one equipment rack comprises mounting the power interconnect assembly such that it extends along the row or column of UPS system component modules; and
pluggably mating respective ones of the first connectors with respective ones of the second connectors such that the power interconnect assembly provides electrical interconnection among the plurality of UPS system component modules.

13. The method of claim 12, wherein arranging the UPS system component modules in a row or column comprises arranging the UPS system component modules in a vertical column in a single equipment rack and wherein mounting the power interconnect assembly such that it extends along the row or column of UPS system component modules comprises mounting the power interconnect assembly vertically in and/or on the single equipment rack.

14. The method of claim 12, wherein arranging a plurality of UPS system component modules in the at least one equipment rack comprises arranging the UPS system component modules in a horizontal row of equipment racks and wherein mounting the power interconnect assembly such that it extends along the row or column of UPS system component modules comprises mounting the power interconnect assembly horizontally in and/or on the row of equipment racks.

15. The method of claim 12:
wherein the plurality of UPS system component modules comprises a plurality of UPS modules; and
wherein pluggably mating respective ones of the first connectors with respective ones of the second connectors such that the power interconnect assembly provides electrical interconnection among the plurality of UPS system component modules comprises pluggably mating respective ones of the first connectors with respective ones of the second connectors such that the power interconnect assembly provides input and/or output paralleling of the UPS modules.

16. The method of claim 12:
wherein the plurality of UPS system component modules comprises a plurality of UPS modules;
wherein the power cables comprise power output cables coupled to power outputs of the UPS modules;
wherein the plurality of UPS modules further comprises power outlets electrically coupled to the power outputs;
wherein pluggably mating respective ones of the first connectors with respective ones of the second connectors such that the power interconnect assembly provides electrical interconnection among the plurality of UPS system component modules comprises pluggably mating respective ones of the first connectors with respective ones of the second connectors such that the power interconnect assembly provides output paralleling of the UPS modules; and
wherein the method further comprises electrically coupling external loads to the power outlets of the UPS modules.

17. The method of claim 12:
wherein the plurality of UPS system component modules comprises a power distribution module and a UPS module and the power cables comprise a first power cable coupled to a power output of the UPS module and a second power cable coupled to a power input of the power distribution module; and
wherein pluggably mating respective ones of the first connectors with respective ones of the second connectors such that the power interconnect assembly provides electrical interconnection among the plurality of UPS system component modules comprises pluggably mating respective ones of the first connectors with respective ones of the second connectors such that the power interconnect assembly provides electrical interconnection among the plurality of UPS system component modules to electrically interconnect the power output of the UPS module and the power input of the power distribution unit.

18. The method of claim 12, wherein the plurality of UPS system component modules comprises a UPS module, a battery module, a transformer module, a switch module, and/or a power distribution unit (PDU) module.

\* \* \* \* \*

UNITED STATES PATENT AND TRADEMARK OFFICE
CERTIFICATE OF CORRECTION

PATENT NO. : 7,760,516 B2  Page 1 of 1
APPLICATION NO. : 11/378140
DATED : July 20, 2010
INVENTOR(S) : Johnson, Jr. et al.

It is certified that error appears in the above-identified patent and that said Letters Patent is hereby corrected as shown below:

Column 7, Line 48: Please correct "$L_0$, $L_0$", $L_0$'" to read -- $L_0$, $L_0$', $L_0$" --

Signed and Sealed this

Twenty-first Day of December, 2010

David J. Kappos
*Director of the United States Patent and Trademark Office*